United States Patent [19]

Motoda

[11] Patent Number: 5,272,109

[45] Date of Patent: Dec. 21, 1993

[54] METHOD FOR FABRICATING VISIBLE LIGHT LASER DIODE

[75] Inventor: Takashi Motoda, Itami, Japan

[73] Assignee: Mitsubishi Denki Kabushiki Kaisha, Tokyo, Japan

[21] Appl. No.: 861,115

[22] Filed: Mar. 31, 1992

[30] Foreign Application Priority Data

Apr. 9, 1991 [JP] Japan ........................... 3-106783

[51] Int. Cl.$^5$ ................... H01L 21/20; H01S 3/19
[52] U.S. Cl. ....................... 437/129; 437/133; 372/45; 372/46
[58] Field of Search ........... 437/107, 129, 133; 372/45, 46

[56] References Cited

U.S. PATENT DOCUMENTS

| 5,003,549 | 3/1991 | Mitsui et al. | 372/46 |
| 5,023,199 | 6/1991 | Murakami et al. | 437/167 |
| 5,053,356 | 10/1991 | Mitsui et al. | 437/129 |
| 5,079,184 | 1/1992 | Hatano et al. | 437/107 |
| 5,151,913 | 9/1992 | Ueno | 372/46 |
| 5,168,077 | 12/1992 | Ashizawa et al. | 437/107 |

FOREIGN PATENT DOCUMENTS

| 0358842 | 4/1989 | European Pat. Off. | |
| 0334637 | 9/1989 | European Pat. Off. | |
| 4010133 | 10/1990 | Fed. Rep. of Germany | |
| 59-149079 | 8/1984 | Japan | 437/129 |
| 63-17586 | 1/1988 | Japan | |
| 63-88820 | 4/1988 | Japan | |
| 63-100788 | 5/1988 | Japan | |

OTHER PUBLICATIONS

Tanaka et al, "Transverse-Mode-Stabilized Ridge Stripe AlGaInP Semiconductor Lasers Incorporating A Thin GaAs Etch-Stop Layer", Applied Physics Letters, vol. 54, No. 15, 1989, pp. 1391-1393.

Nitta et al, "Astigmatism In Ridge-Stripe InGaAlP Laser Diodes", Japanese Journal of Applied Physics, vol. 28, No. 11, 1989, pp. L2089-L2091.

Kawata et al, "Room-Temperature, Continuous-Wave Operation for Mode-Stabilised AlGaInP Visible-Light Semiconductor Laser with a Multiquantum-Well Active Layer", Electronics Letters, vol. 24, No. 24, 1988, pp. 1489-1490.

Kobayashi et al., "AlGaInP Double Heterostructure Visible-Light Laser Diodes with a GaInP Active Layer Grown by Metalorganic Vapor Phase Epitaxy", IEEE Journal of Quantum Electronics vol. QE-23, No. 6, Jun. 1987, pp. 704-711.

Bour et al, "Organic Vapor Epitaxial Growth of $(Al_x Ga_{1-x})_{0.5}In_{0.5}P$ and its Heterostructures", IEEE Journal of Quantum Electronics, vol. 14, No. 9, Sep. 1988, pp. 1856-1863.

Ohba et al, "Pulsed Operation of InGaAlP/InGaP DH Lasers Prepared by MOCDV Employing Methyl Metalorganics", Institute of Physics Conference, Series 79, Chapter 12, 1985, pp. 679-684.

Katsuyama et al, "Very Low Threshold Current AlGaInP/$Ga_xIn_{1-x}P$ Strained Single Quantum Well Visible Laser Diode", Electronics Letters, vol. 26, No. 17 Aug. 1990, pp. 1375-1377.

Primary Examiner—Mary Wilczewski
Attorney, Agent, or Firm—Leydig, Voit & Mayer

[57] ABSTRACT

A method for fabricating a visible light laser diode includes growing a double heterojunction structure of AlGaInP/GaInP/AlGaInP on a GaAs substrate, forming a stripe-shaped ridge in the double heterojunction structure using a dielectric film as an etching mask, selectively growing n type GaAs by MOCVD using the dielectric film as a growth mask to form a GaAs current blocking layer burying the ridge, removing the dielectric film and growing a GaAs contact layer on the current blocking layer and the ridge. The step of selectively growing the GaAs current blocking layer includes growing a first GaAs layer on the double heterojunction structure at both sides of the ridge and on the side walls of the ridge using triethylgallium (TEG) as a Ga source and growing a second GaAs layer on the first GaAs layer using trimethylgallium (TMG) as a Ga source. The side walls of the ridge are covered by the first GaAs layer and are not exposed to a high temperature in an $AsH_3$ ambient, thereby reducing damage to the double heterojunction structure. In addition, since the second GaAs layer is grown using TMG as the Ga source, cavities are not produced in the GaAs layer.

11 Claims, 6 Drawing Sheets

F I G. 2
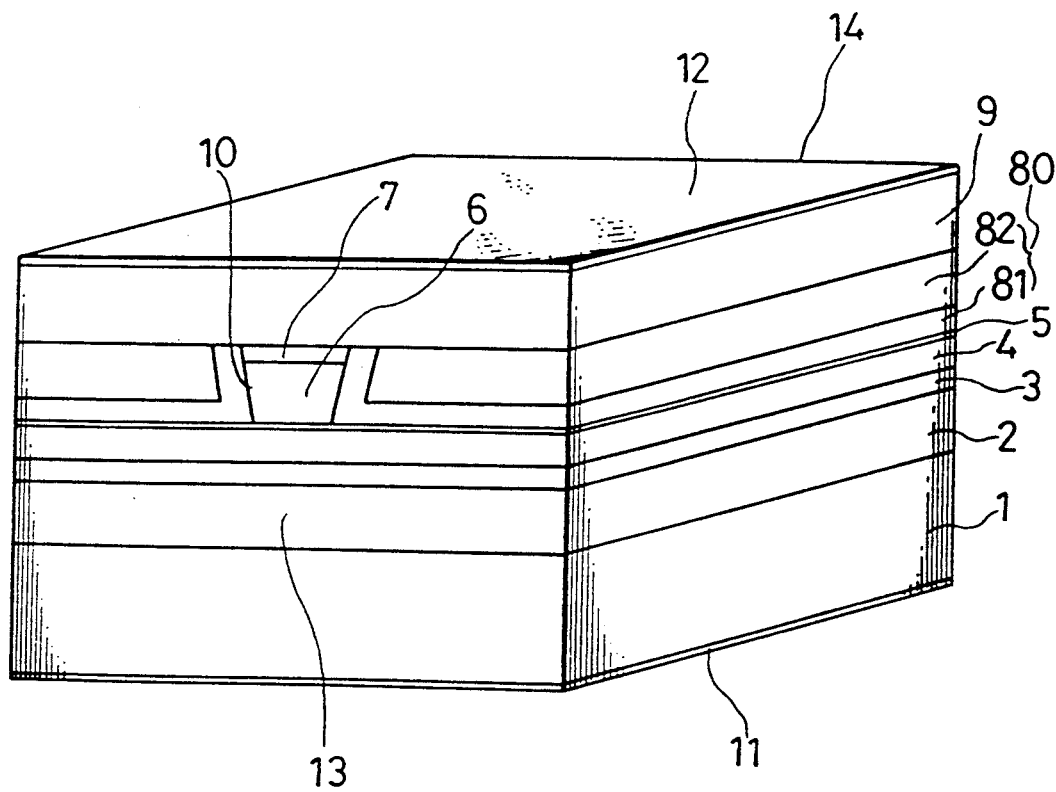

METHOD FOR FABRICATING VISIBLE LIGHT LASER DIODE

FIELD OF THE INVENTION

The present invention relates to a method for fabricating a ridge waveguide type visible light laser diode having a double heterojunction structure and, more particularly, to preventing deterioration of the double heterojunction structure due escape of phosphorus from the side walls of the ridge during burying of the ridge.

BACKGROUND OF THE INVENTION

FIG. 3 is a perspective view of a ridge waveguide type visible-light laser diode having a double heterojunction structure in accordance with the prior art. In FIG. 3, reference numeral 1 designates an n type GaAs substrate. An n type AlGaInP lower cladding layer 2 is disposed on the substrate 1. A p type AlGaInP lightguide layer 4 is disposed on the active layer 3. A p type GaInP etch-stop layer 5 is disposed on the lightguide layer 4. A p type AlGaInP upper cladding layer 6 is disposed on the etch-stop layer 5. A p type GaAs cap layer 7 is disposed on the upper cladding layer 6. The upper cladding layer 6 and the cap layer 7 are formed by selective etching using the etch-stop layer 5, resulting in a stripe-shaped ridge 10 extending between the resonator facets 13 and 14. An n type GaAs current blocking layer 8 is disposed on the etch-stop layer 5 to bury the ridge 10. A p type GaAs contact layer 9 is disposed on the current blocking layer 8 and the ridge 10. An n side electrode 11 is disposed on the rear surface of the substrate 1 and a p side electrode 12 is disposed on the contact layer 9.

A method for fabricating the visible-light laser diode of FIG. 3 is illustrated in FIGS. 4(a) to 4(g). In these figures, the same reference numerals as those shown in FIG. 3 designate the same parts, and reference numeral 20 designates a silicon nitride (hereinafter referred to as $SiN_x$) layer. Arsine (hereinafter referred to as $AsH_3$) 21 and trimethylgallium (hereinafter referred to as TMG) 22 are used as the As source and the Ga source, respectively.

As shown in FIG. 4(a), a p type AlGaInP lower cladding layer 2, a GaInP active layer 3, a p type AlGaInP lightguide layer 4, a p type GaInP etch-stop layer 5, a p type AlGaInP upper cladding layer 6 and a p type GaAs cap layer 7 are successively grown on an n type GaAs substrate 1 (first crystal growth). Thereafter, as shown in FIG. 4(b), a $SiN_x$ film 20 is deposited on the cap layer 7 and, as shown in FIG. 4(c), it is patterned into a stripe configuration by photolithography and etching techniques. Then, as shown in FIG. 4(d), using the patterned $SiN_x$ film 20 as a mask, the p type AlGaInP upper cladding layer 6 and the p type GaAs cap layer 7 are partially etched away by selective etching using the etch-stop layer 5, resulting in a ridge 10. Then, using the $SiN_x$ film 20 on the ridge 10 as a mask for selective growth, an n type GaAs current blocking layer 8 is selectively grown on the etch-stop layer 5 to bury the ridge 10. Here, $AsH_3$ is used as the As source and TMG is used as the Ga source. When TMG 22 is used as the Ga source, as shown in FIG. 4(e), the n type GaAs layer is not grown on the side walls of the ridge 10 comprising AlGaInP series material but grows as flat layer on the GaInP etch-stop layer 5, resulting in the n type GaAs current blocking layer 8 shown in FIG. 4(f) (second crystal growth). Then, as shown in FIG. 4(g), the $SiN_x$ film 20 is removed and a p type GaAs contact layer 9 is grown on the current blocking layer 8 and the ridge 10 (third crystal growth). Thereafter, a p side electrode 14 and an n side electrode II are formed on the contact layer 9 and the rear surface of substrate 1, respectively, by sputtering. Then, the wafer is divided into chips, resulting in the visible-light laser diode shown in FIG. 3

In accordance with the prior art method for fabricating a visible light laser diode, since TMG is used as the Ga source in the second crystal growth for growing the n type GaAs current blocking layer, the GaAs layer is not grown on the side walls of the ridge comprising AlGaInP series material. Therefore, during the second epitaxial growth, the side walls of the ridge are exposed to a high temperature in an $AsH_3$ atmosphere for a long time and phosphorus escapes from the side walls of the ridge, whereby the double heterojunction structure is damaged, resulting in deterioration of the characteristics of the laser.

Referring to FIG. 5(a), when the GaAs current blocking layer is formed using triethylgallium (hereinafter referred to as TEG) as the Ga source, the GaAs layer 8' is grown on the side walls of the ridge 10, so that the side walls of the ridge are completely covered with the GaAs layer. However, since the growth of the GaAs layer 8' proceeds vertically from the surface of the etch-stop layer and horizontally from the side walls of the ridge as shown in FIG. 5(a), cavities 30 are undesirably produced in the GaAs current blocking layer 8' as shown in FIG. 5(b), adversely affecting the current blocking characteristic.

SUMMARY OF THE INVENTION

It is an object of the present invention to provide a method for fabricating a visible light laser diode having a double heterojunction structure that prevents deterioration of the double heterojunction structure due to exposure of the side walls of the ridge comprising AlGaInP to a high temperature in an $AsH_3$ atmosphere, causing escape of phosphorus from the side walls in the step of growing an n type GaAs layer to bury the ridge, and that produces a current blocking layer having high reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a method for fabricating a visible-light laser diode according to the present invention, a second epitaxial growth for growing a GaAs layer to bury a ridge includes a step of forming a first GaAs layer using TEG as the Ga source and a step of forming a second GaAs layer on the first GaAs layer using TMG as the Ga source. Since TEG is used as the Ga source in the first GaAs growth, the first GaAs layer is grown on the side walls of the ridge and thus the side walls are not exposed to a high temperature in an $AsH_3$ atmosphere for a long time, so that damage to the double heterojunction structure is reduced. In addition, since the second GaAs layer is grown using TMG as the Ga source, cavities, which are generated in the GaAs layer when using TEG as Ga source, are not formed

BRIEF DESCRIPTION OF THE DRAWINGS

FIG. 2 is a perspective view showing a structure of a visible light laser diode fabricated through the process steps of FIGS. 1(a) and 1(b);

DETAILED DESCRIPTION OF THE PREFERRED EMBODIMENTS

Figure 1A:
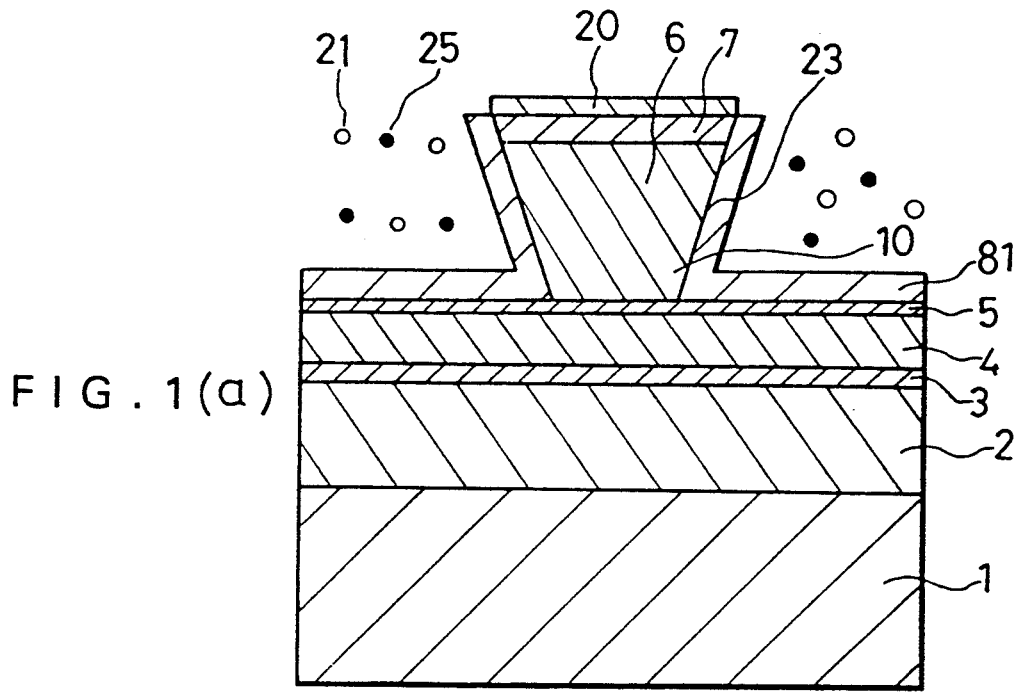
FIGS. 1(a) and 1(b) are cross-sectional views illustrating major process steps in a method for fabricating a visible light laser diode in accordance with an embodiment of the present invention.

An embodiment of the present invention will be described in detail with reference to the drawings FIG. 2 is a perspective view showing a structure of a visible light laser diode fabricated by a method for fabricating a visible light laser diode according to the present invention. In FIG. 2, reference numeral 1 designates an n type GaAs substrate. An n type AlGaInP lower cladding layer 2 is disposed on the substrate 1 A GaInP active layer 3 is disposed on the lower cladding layer 2 A p type AlGaInP lightguide layer 4 is disposed on the active layer 3. A p type GaInP etch-stop layer 5 is disposed on the lightguide layer 4. A p type AlGaInP upper cladding layer 6 is disposed on the etch-stop layer 5. A p type GaAs cap layer 7 is disposed on the upper cladding layer 6. The upper cladding layer 6 and the cap layer 7 are formed by selective etching using the etch-stop layer 5, resulting in a stripe-shaped ridge 10 extending between resonator facets 13 and 14. An n type current blocking layer 80 comprises a first GaAs layer 81 and a second GaAs layer 82. The first GaAs layer 81 is disposed on the etch-stop layer 5 and the side walls of the ridge 10 to bury the ridge 10. The second GaAs layer 82 is disposed on the first GaAs layer 81. A p type GaAs contact layer 9 is disposed on the current blocking layer 8 and the ridge 10. An n side electrode 11 is disposed on the rear surface of substrate 1 and a p side electrode 12 is disposed on the contact layer 9

Figure 1B:
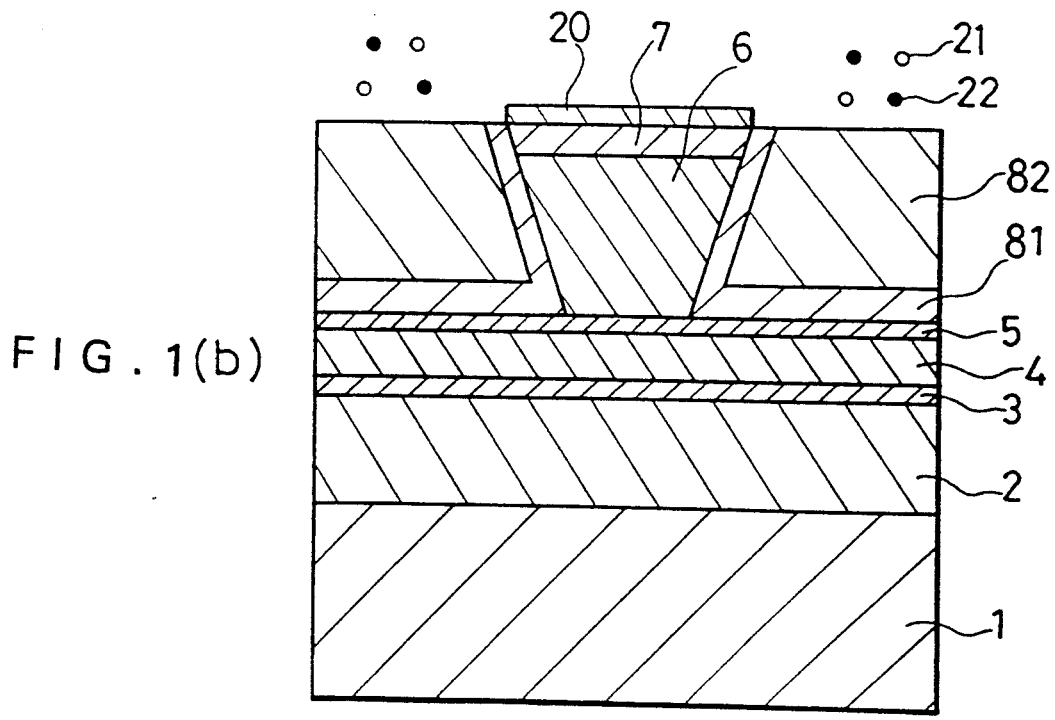
Figure 3:
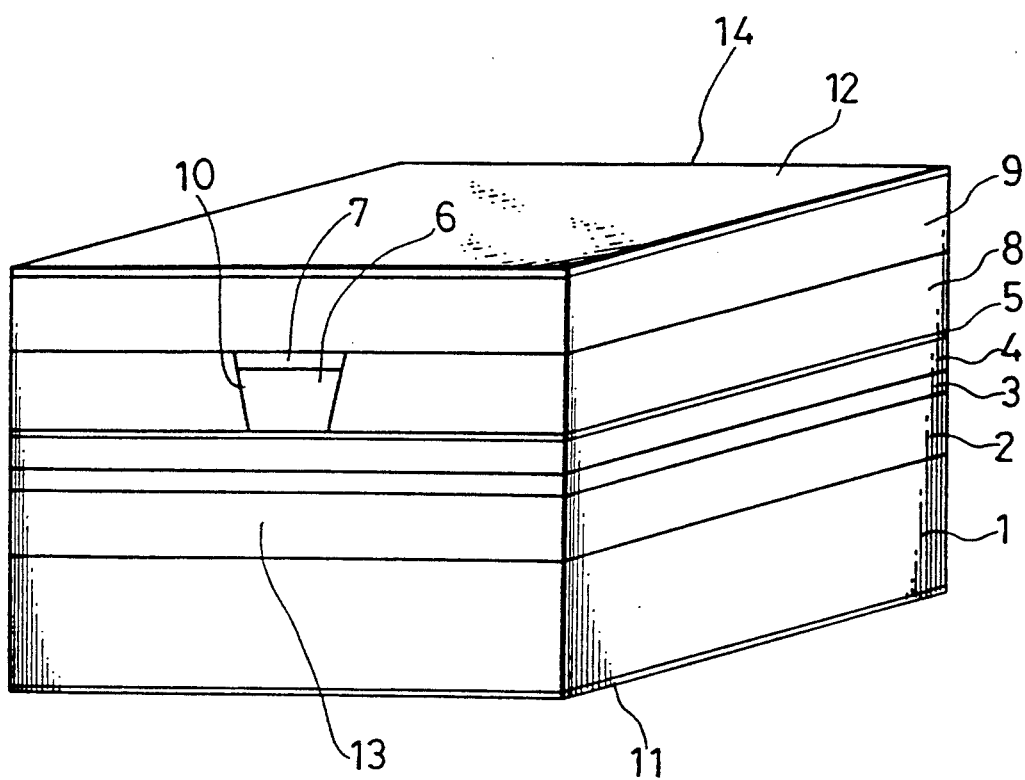
FIG. 3 is a perspective view showing a structure of a visible light laser diode in accordance with the prior art.
Figure 4A:
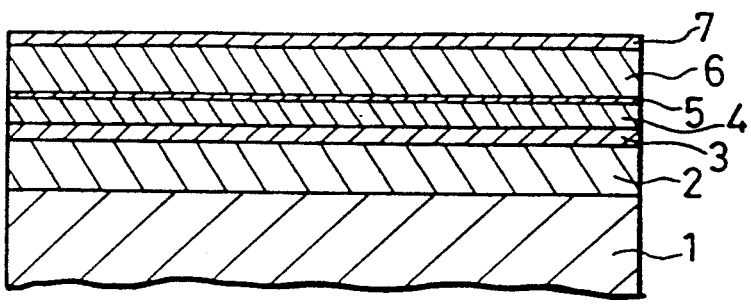
FIGS. 4(a) to 4(g) are cross-sectional views illustrating major process steps in a method for fabricating the visible light laser diode of FIG. 3.
Figure 4B:
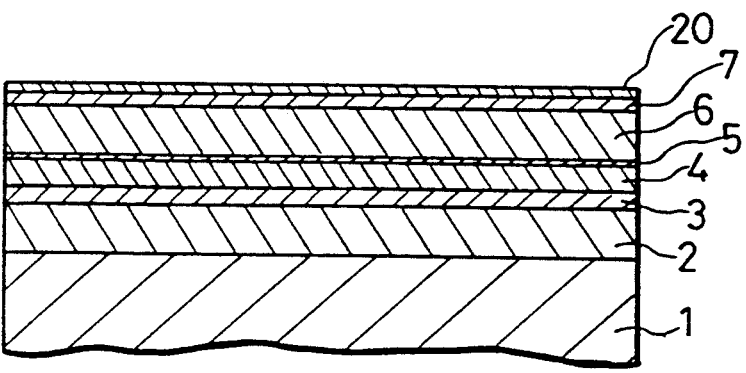
Figure 4C:
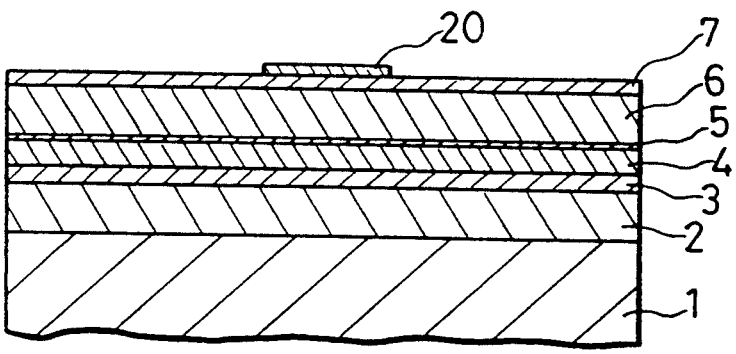
Figure 4D:
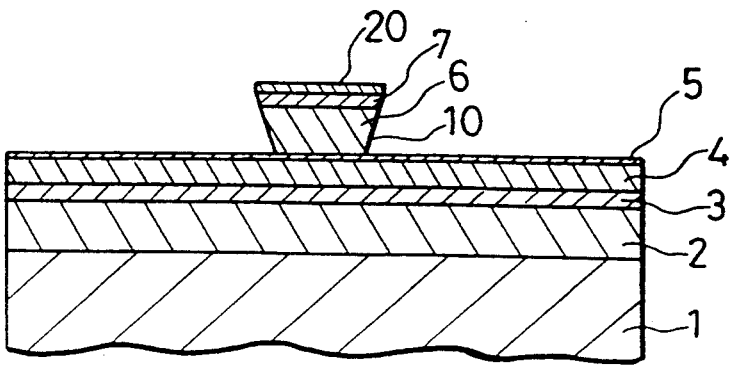
Figure 4E:
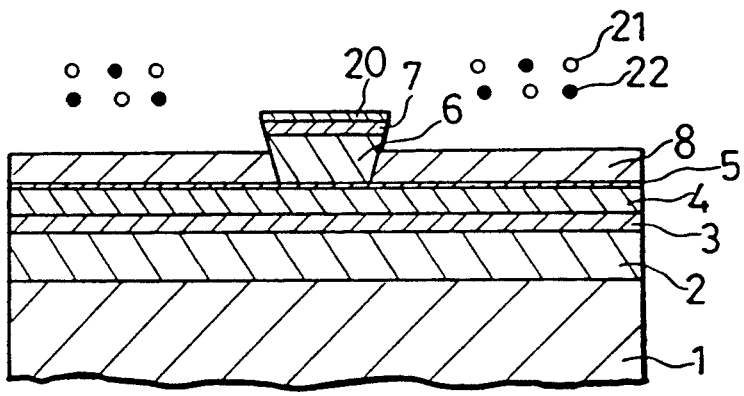
Figure 4F:
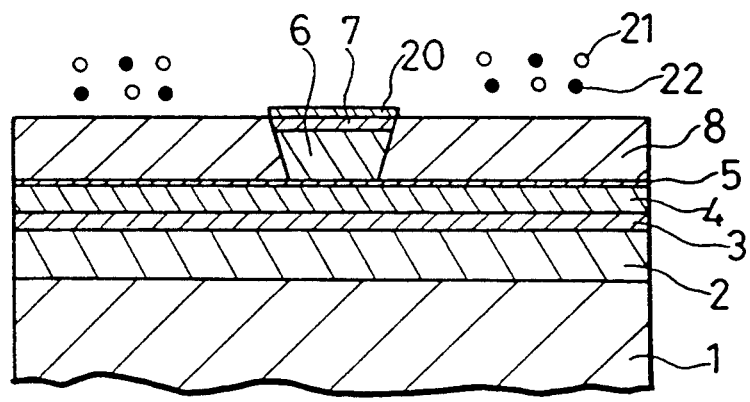
Figure 4G:
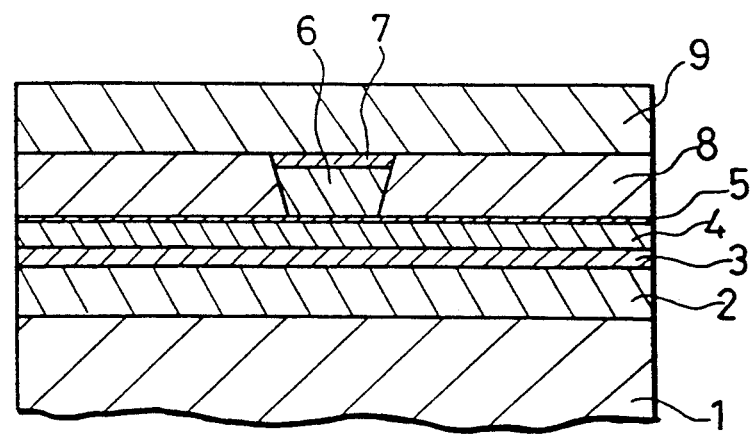

A method for fabricating the visible-light laser diode of FIG. 2 is illustrated in FIGS. 1(a) and 1(b). In these figures, the same reference numerals as those in FIG. 2 designate the same parts. Reference numeral 20 designates a SiN$_x$ film. Here, AsH$_3$ 21 is used as the As source, TEG 25 is used as the Ga source in the step of growing a first GaAs layer, and TMG 22 is used as the Ga source in the step of growing a second GaAs layer.

First, a p type AlGaInP lower cladding layer 2 of approximately 1.0 micron thickness, a GaInP active layer 3 of approximately 0.07 micron thickness, a p type AlGaInP light guide layer 4 of 0.3 to 0.4 micron thickness, a p type GaInP etch-stop layer 5 of 50 to 100 angstroms thickness, a p type AlGaInP upper cladding layer 6 of approximately 0.7 micron thickness and a p type GaAs cap layer 7 of 0.3 to 0.4 micron thickness are successively grown on an n type GaAs substrate 1 by MOCVD (first epitaxial growth). Thereafter, a SiN$_x$ film 20 is deposited on the cap layer 7 and then it is patterned in a stripe configuration by photolithography and etching techniques. Then, using the patterned SiN$_x$ film 20 as a mask, the p type AlGaInP upper cladding layer 6 and the p type GaAs cap layer 7 are partially etched away by selective etching using the etch-stop layer 5, resulting in a ridge 10.

A second epitaxial growth in accordance with the embodiment of the present invention, i.e., a process for forming an n type GaAs current blocking layer 80 selectively on the etch-stop layer 5 using the SiN$_x$ film 20 on the ridge 10 as a mask for selective growth to bury the ridge 10, will be described in detail.

In this embodiment, the n type GaAs current blocking layer 80 comprises the first GaAs layer 81 and the second GaAs layer 82. The first n type GaAs layer 81 is grown using TEG as the Ga source and the second n type GaAs layer 82 is grown using TMG as the Ga source, both layers being grown by MOCVD.

When a crystal growth is carried out using the SiN$_x$ film 20 as a mask for selective growth, AsH$_3$ 21 as the As source and TEG 25 as the Ga source, the n type GaAs layer 81 is grown not only on the etch-stop layer 5 but also on both side walls 23 of the ridge 10 comprising a material including phosphorus, such as AlGaInP, as shown in FIG. 1(a). As a result, in the early stage of the growth, the side walls 23 of the ridge 10 are covered with the n type GaAs layer 81. Therefore, during the second epitaxial growth, the side walls of the ridge comprising a phosphorus-containing material are not exposed to a high temperature in an As atmosphere for a long time and phosphorus hardly escapes from the side walls.

Figure 5A:
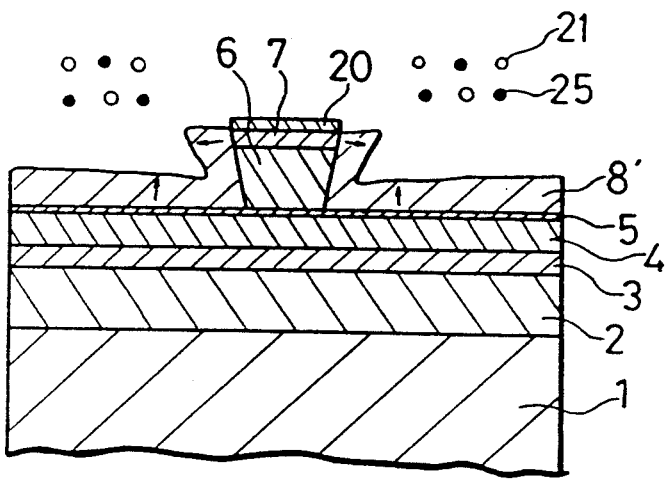
FIGS. 5(a) and 5(b) are cross-sectional views for explaining a problem arising when a GaAs current blocking layer is formed using TEG as the Ga source.
Figure 5B:
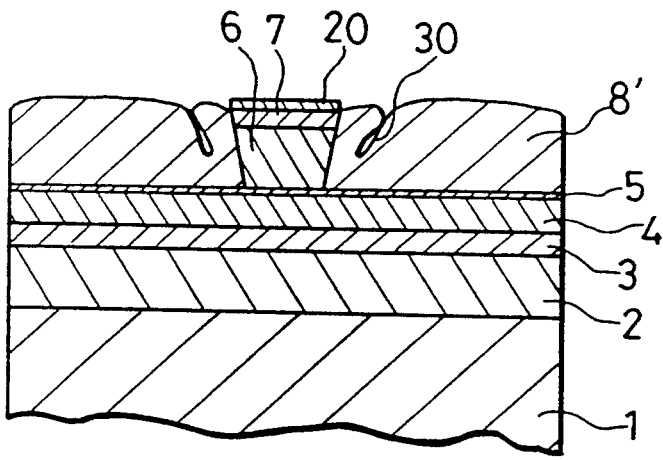

The n type GaAs layer 81 is grown to a thick enough to prevent the damage affecting the double heterojunction structure, i e., about 0.5 micron and, thereafter, the Ga source is switched from TEG 25 to TMG 22 to form the second GaAs layer 82 successively. When TMG 22 is used as the Ga source, the n type GaAs is not grown on the side walls of the ridge but is grown only on the (100) plane as shown in FIG. 5(a). Therefore, as shown in FIG. 1(b), the ridge 10 can be buried by the GaAs layer 82 and cavities 30 shown in FIG. 5(b) are not formed. The total thickness of the current blocking layer 80 is about 1.0 micron.

After the growth of the second GaAs layer 82 is completed, the SiN$_x$ film 20 is removed and a p type GaAs contact layer 9 approximately 3 microns thickness is formed on the current blocking layer 80 and the ridge 10 by MOCVD (third epitaxial growth). Thereafter, a p side electrode 12 and an n side electrode 11 are formed on the contact layer 9 and the rear surface of substrate 1, respectively, by such as sputtering. Then, the wafer is divided into chips, resulting in the visible-light laser diode shown in FIG. 2

As described above, in a method for fabricating a visible light laser diode according to the present invention, a second epitaxial growth for growing a GaAs layer to bury a ridge includes a step of forming a first GaAs layer using TEG as the Ga source and a step of forming a second GaAs layer on the first GaAs layer using TMG as the Ga source. Therefore, both side walls of the ridge are covered with the first GaAs layer and the side walls are not exposed to a high temperature in an AsH$_3$ atmosphere for a long time, so that the damage to the double heterojunction structure is reduced. In addition, since the second GaAs layer is grown using TMG as the Ga source, cavities, which are generated in the GaAs layer when using TEG as the Ga source, are not generated.

What is claimed is:

1. A method for fabricating a visible light laser diode comprising:
   growing a double heterojunction structure comprising AlGaInP/GaInP/AlGaInP on a GaAs substrate;
   forming a stripe-shaped ridge having side walls in said double heterojunction structure using a dielectric film as a mask;
   selectively growing GaAs by MOCVD using said dielectric film as a growth mask to form a GaAs current blocking layer burying said ridge;
   removing said dielectric film; and
   growing a GaAs contact layer on said current blocking layer and said ridge wherein selectively growing said GaAs current blocking layer includes growing a first GaAs layer beside said ridge and on the side walls of said ridge by MOCVD using triethylgallium (TEG) as a Ga source and growing a second GaAs layer on said first GaAs layer by MOCVD using trimethylgallium (TMG) as a Ga source.

2. A method for fabricating a visible light laser diode in accordance with claim 1 wherein arsine (AsH$_3$) is used as an As source in said step of selectively growing said GaAs current blocking layer.

3. A method for fabricating a visible light laser diode in accordance with claim 2 including depositing SiN$_x$ as said dielectric film.

4. A method for fabricating a visible light laser diode in accordance with claim 1 including depositing SiN$_x$ as said dielectric film.

5. A method for fabricating a visible light laser diode in accordance with claim 1 including growing said first GaAs layer to a thickness of approximately 0.5 micron.

6. A method for fabricating a visible light laser diode in accordance with claim 1 including growing an etch-stop layer within said double heterojunction structure and forming said ridge by selectively etching said double heterojunction structure using said etch-stop layer to prevent etching of layers conveyed by said etch-stop layer.

7. A method for fabricating a visible light laser diode comprising:
   successively growing an n type AlGaInP lower cladding layer, a GaInP active layer, a p type AlGaInP first upper cladding layer, a p type GaInP etch-stop layer, a p type GlGaInP second upper cladding layer, and a p type GaAs cap layer on an n type GaAs substrate;
   forming a dielectric film patterned in a stripe configuration in a resonator length direction on said cap layer;
   forming a stripe-shaped ridge having side walls of said cap layer and said second upper cladding layer by selective etching using said etch-stop layer to prevent etching of layers covered by said etch-stop layer and using said dielectric film as an etching mask;
   selectively growing a first n type GaAs layer on the surface of said etch-stop layer and on the side walls of said ridge by MOCVD using triethylgallium (TEG) as a Ga source and said dielectric film as a growth mask;
   selectively growing a second n type GaAs layer on said first n type GaAs layer by MOCVD using trimethylgallium (TMG) as a Ga source and using said dielectric film as a growth mask, burying said ridge;
   removing said dielectric film and growing a p type GaAs contact layer on said ridge and said second n-type GaAs layer; and
   forming an n side electrode on said substrate and a p side electrode on said contact layer, respectively.

8. A method for fabricating a visible light laser diode in accordance with claim 7 wherein arsine (AsH$_3$) is used as an As source in said steps of selectively growing said first and second n type GaAs layers.

9. A method for fabricating a visible light laser diode in accordance with claim 8 including depositing SiN$_x$ as said dielectric film.

10. A method for fabricating a visible light laser diode in accordance with claim 7 including depositing SiN$_x$ as said dielectric film.

11. A method for fabricating a visible light laser diodes in accordance with claim 7 including growing said first GaAs layer to a thickness of approximately 0.5 micron.

* * * * *